United States Patent [19]

Kushihara

[11] Patent Number: 5,796,357
[45] Date of Patent: Aug. 18, 1998

[54] DIGITAL ANGLE DETECTING METHOD

[75] Inventor: Hiroshi Kushihara, Iida, Japan

[73] Assignee: Tamagawa Seiki Kabushiki Kaisha, Nagano-Ken, Japan

[21] Appl. No.: 597,181

[22] Filed: Feb. 6, 1996

[30] Foreign Application Priority Data

Jun. 7, 1995 [JP] Japan ................................. 7-140707

[51] Int. Cl.$^6$ ................................................. H03M 1/48
[52] U.S. Cl. ................................................. 341/116
[58] Field of Search ....................... 341/112, 1, 111, 341/113, 114, 115, 116, 117; 318/661, 605

[56] References Cited

U.S. PATENT DOCUMENTS 4,795,954  1/1989  Sakurai et al. ............... 318/661

*Primary Examiner*—Brian K. Young
*Attorney, Agent, or Firm*—Sughrue, Mion, Zinn, Macpeak & Seas, PLLC

[57] ABSTRACT

A digital angle detecting method adapted to obtain a stable digital angle output, which is little affected by cable length, uses a resolver of the amplitude modulation type. The respective phases of two-phase resolver signals are first shifted, and are then added to the original two-phase synthetic signals. Subsequently, another signal is synthesized by multiplying the two synthetic signals by two-phase sine-wave signals. Finally, an angle output and an angular velocity output is obtained by using the synthesized signal.

4 Claims, 3 Drawing Sheets

DIGITAL ANGLE DETECTING METHOD

BACKGROUND OF THE INVENTION

1. Field of the Invention

The present invention generally relates to a digital angle detecting method, and more particularly to a novel improvement of a digital angle detecting method for obtaining a stable digital angle output, which is little affected by a cable length and so on, by using a one-phase-excitation/two-phase-output resolver of the amplitude modulation type.

2. Description of the Related Art

Generally, there are two types of conventional systems for performing such a digital angle detecting method, namely, a tracking type and a phase type. FIG. 1 illustrates the configuration of a typical example of the phase type system, which is chosen from among the conventional systems.

Namely, as illustrated in this figure, a one-phase resolver signal sin ($\omega t-\theta$) obtained from a resolver 2, to which a two-phase excitation signal sin $\omega t$, cos $\omega t$ sent from a two-phase excitation circuit 1 has been inputted, is inputted to a phase comparing circuit 4 through a waveform shaping circuit 3. Then, an output signal 4a of this phase comparing circuit 4 passes through a loop filter 5, a variable frequency generator (namely, a voltage controlled oscillator (VCO)) 6 and an output counter 7 which outputs a digital angle output $\phi$ ($\phi=\theta$). Further, a ring counter 9 connected to the two-phase excitation circuit 1 is also connected to a subtraction circuit 8 which is connected with the output counter 7.

The system for performing the conventional digital angle detecting method is constructed as described hereinabove, and thus has the following problem.

Namely, in the case of this conventional system, angular information is detected by the two-phase excitation/one-phase-output resolver as corresponding to a phase difference between resolver signals outputted from the resolver, and is then transmitted from the system. Thus, the angular information is highly dependent on the impedance of a signal transmission line, which is determined on the basis of the length of a cable or line between the resolver and a signal processing portion, and a change in temperature. Consequently, it is difficult to obtain a digital angle output with high precision. Moreover, the conventional system requires two-phase excitation circuit. Thus, the configuration of the conventional system is complex. Further, the manufacturing cost of the conventional system is high.

The present invention resolves the aforementioned problem of the conventional system.

Accordingly, an object of the present invention is to provide a digital angle detecting method for obtaining a stable digital angle output, which is little affected by the cable length and the change in temperature, by using a one-phase-excitation/two-phase-output resolver of the amplitude modulation type similarly as in the case of the conventional tracking type system.

SUMMARY OF THE INVENTION

To achieve the foregoing object, in accordance with the present invention, there is provided a digital angle detecting method which comprises the steps of: shifting the phases of original two-phase resolver signals (sin $\omega_0 t \cdot \sin \omega_E t$ and cos $\omega_0 t \cdot \sin \omega_E t$ (incidentally, $\omega_E$ denotes an exciting angular frequency)) obtained from a resolver of the one-phase-excitation/two-phase-output type, which is supplied with an exciting source signal (sin $\omega_E t$) and serves as an angle detecting device of the amplitude modulation type, by use of ($-90°$)-phase shifting circuits (10, 11), respectively; obtaining two-phase synthetic signals (sin ($\omega_E-\omega_\theta$)t, cos ($\omega_E-\omega_\theta$) t) by performing additions and subtractions on shifted two-phase resolver signals ($-\sin \omega_0 t \cdot \cos \omega_E t$, $-\cos \omega_0 t \cdot \cos \omega_E t$), which are shifted in phase, and the original two-phase resolver signals (sin $\omega_0 t \cdot \sin \omega_E t$, cos $\omega_0 t \cdot \sin \omega_E t$); obtaining a signal (sin ($\omega_E-\omega_\theta$)t×cos $\omega_R t-\cos (\omega_E-\omega_\theta)$t×sin $\omega_R t=\sin (\omega_E-\omega_\theta-\omega_R)t$) synthesized by multiplying the two-phase synthetic signls (sin ($\omega_E-\omega_\theta$)t, cos ($\omega_E-\omega_\theta$)t) by two-phase sine-wave signals (sin $\omega_R t$ and cos $\omega_R t$); and obtaining an angle output ($\theta$) and angular velocity output ($\omega_\theta$) by using said synthesized signal (sin ($\omega_E-\omega_\theta-\omega_R$)t).

Further, in the case of a practical embodiment of this digital angle detecting method of the present invention, the two-phase resolver signals (sin $\omega_0 t \cdot \sin \omega_E t$, cos $\omega_0 t \cdot \sin \omega_E t$) are monitored by an off-line detection circuit, and the occurrence of a disconnection in the resolver and a signal transmission system is detected from the presence of a voltage represented by each of the two-phase resolver signals.

Moreover, in the case of a practical embodiment of these digital angle detecting methods of the present invention, the occurrence of a system abnormality in a phase-locked loop (PLL) system is detected by monitoring an error voltage by use of the synthesized signal. Thus, in the case of the digital angle detecing method, an amplitude-modulated two-phase resolver signal outputted from a one-phase-excitation/two-phase-output resolver is converted into shifted two-phase resolver signals which are shifted in phase and are further phase-modulated. Further, a PLL system containing an excitation circuit for the excitation of the resolver is constituted. Thereby, the system for performing this digital angle detecting method can produce a stable angle output and angular velocity output that are little affected by the impedance of a signal transmission line, which is determined on the basis of the length of the cable or line between the resolver and the signal processing portion, and a change in temperature. Moreover, the occurrence of a disconnection or an off-line in the resolver itself and the signal transmission system can be detected by monitoring the amplitudes of the two-phase resolver signals and checking whether or not voltages represented by the two-phase resolver signals are present.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF THE PREFERRED EMBODIMENT

Figure 1:
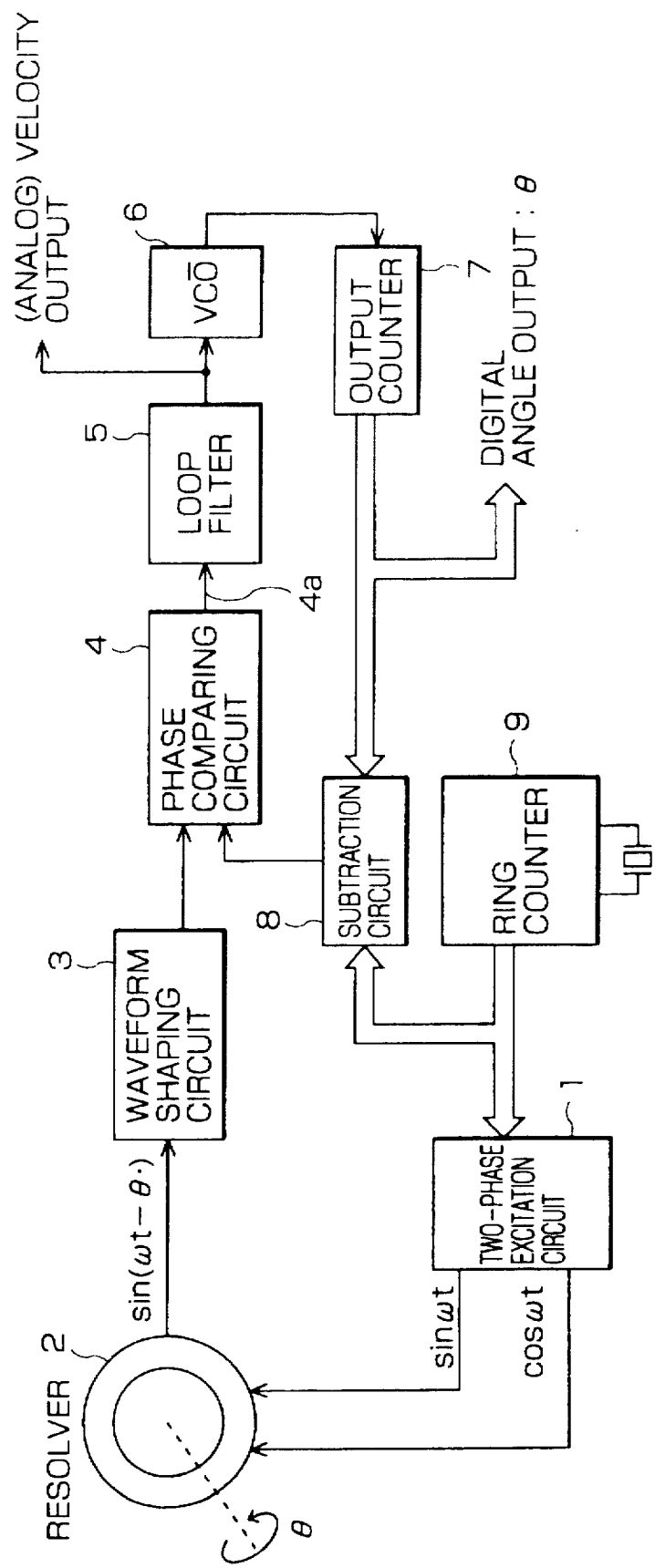
FIG. 1 is a block diagram illustrating the configuration of a typical system for performing a conventional digital angle detecting method.
Figure 2:
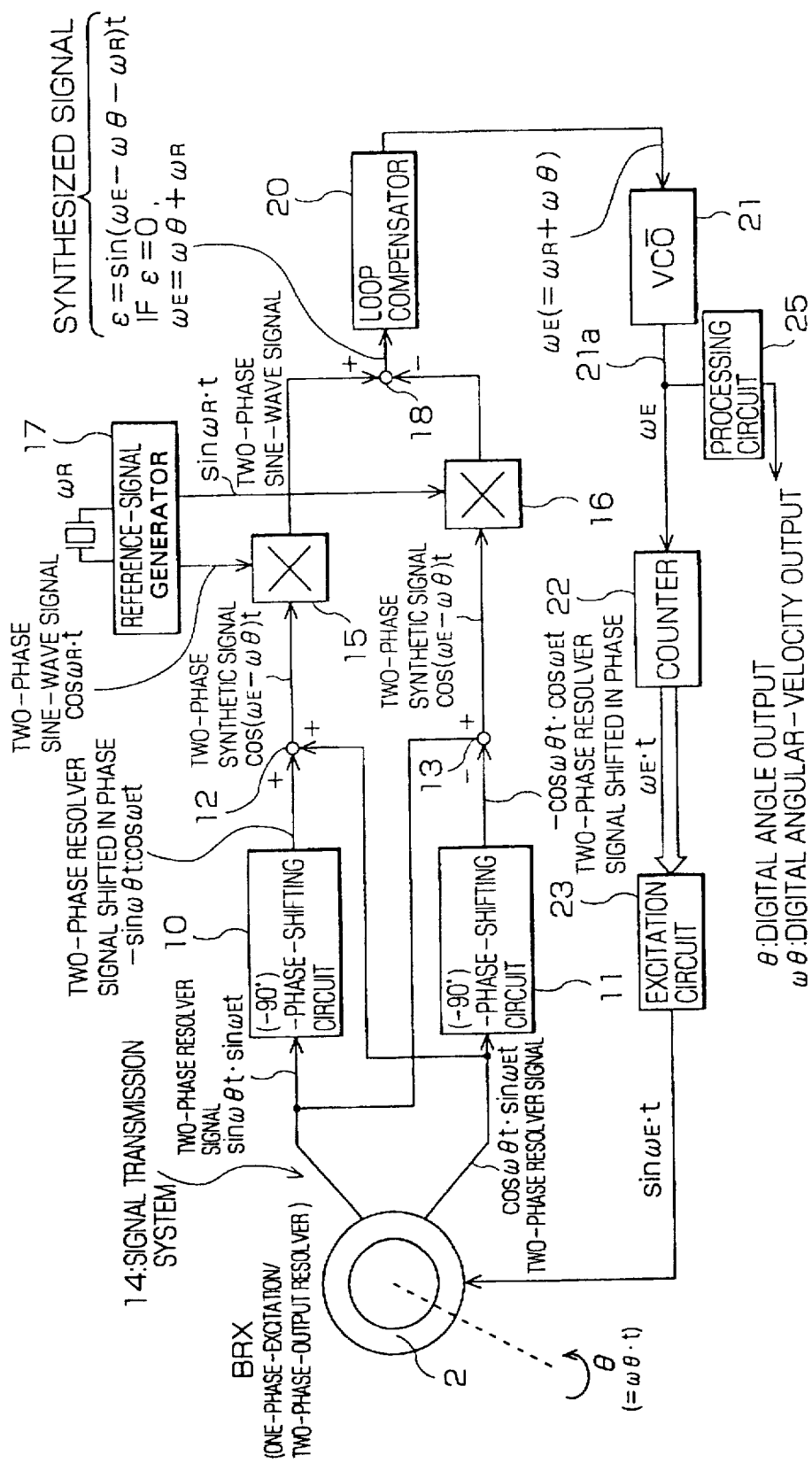
FIG. 2 is a schematic block diagram illustrating the configuration of a sytem for performing a digital angle detecting method of the present invention.
Figure 3:
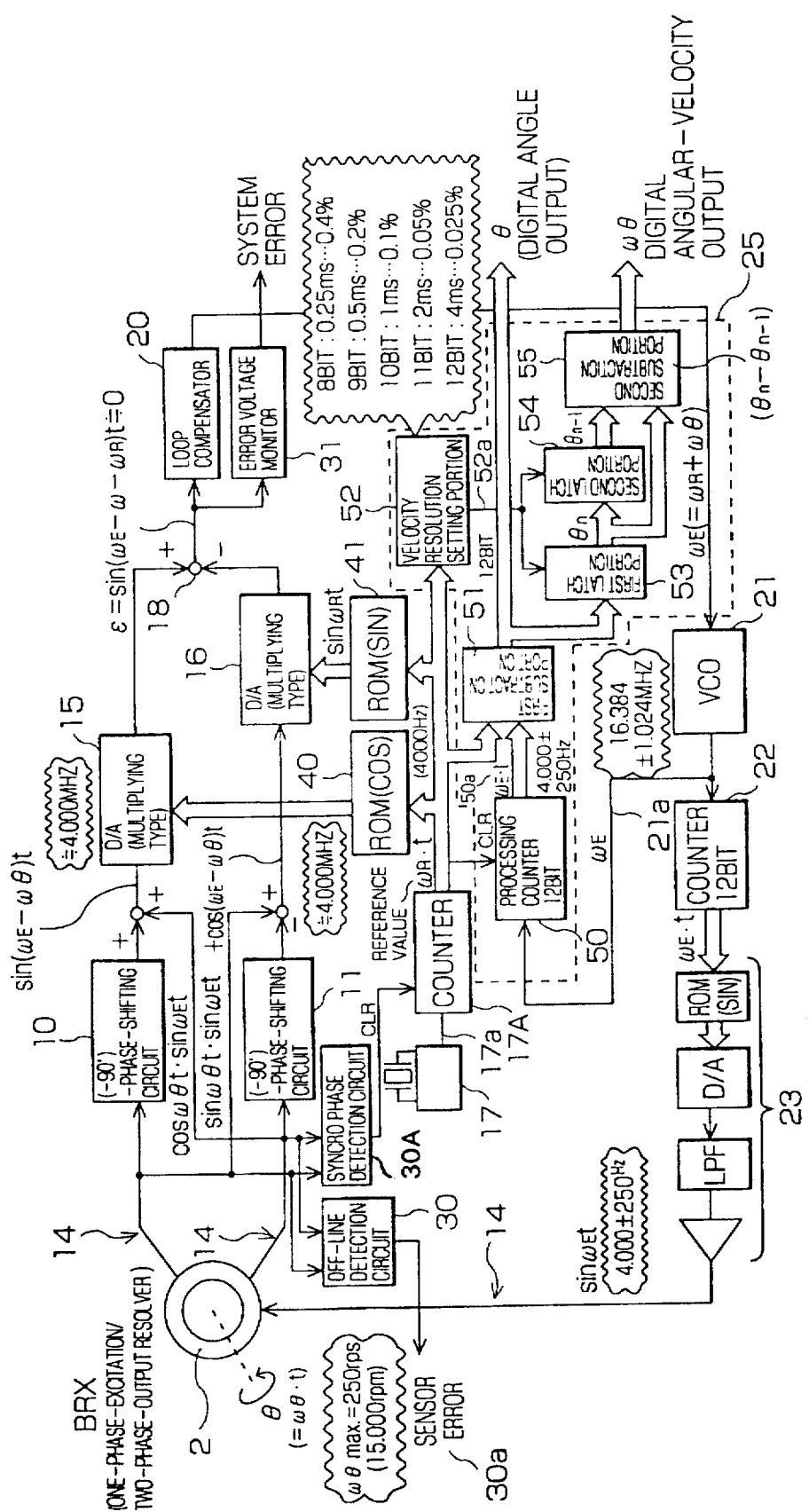
FIG. 3 is a block diagram for showing the configuration of the system of FIG. 2 in more detail.

In FIGS. 2 and 3, like reference characters designate like or corresponding parts of the conventional system shown in FIG. 1.

In FIG. 2, reference numeral 2 designates a well known resolver which is a one-phase-excitation/two-phase-output angle detecting device of the amplitude modulation type. Further, the two-phase resolver signals (sin $\omega_0 t \cdot \sin \omega_E t$, cos $\omega_0 t \cdot \sin \omega_E t$) are shifted in phase by a pair of $-90°$-phase shifting circuits 10 and 11, respectively (for convenience's sake, it is assumed that the amplitudes of the two-phase resolver signals are normalized to one and that the phase difference is zero, and $\omega_E$ denotes an exciting angular frequency). The other two-phase resolver signals (sin $\omega_0 t \cdot \sin \omega_E t$, cos $\omega_0 t \cdot \sin \omega_E t$), which are also outputted from the resolver but are not shifted in phase, are synthesized with the phase shifted signals by an adder 12 and a subtracter 13, as expressed in the following equations according to the well known addition theorem. Namely, $$\sin \omega_0 t \cdot \sin (\omega_E t - 90°) + \cos \omega_0 t \cdot \sin \omega_E t = -\sin \omega_0 t \cdot \cos \omega_E t + \cos \omega_0 t \cdot \cos \omega_E t = \sin (\omega_E - \omega_0)t \quad (1)$$

$$-\cos \omega_0 t \cdot \sin (\omega_E t - 90°) + \sin \omega_0 t \cdot \sin \omega_E t = \cos \omega_0 t \cdot \cos \omega_E t + \sin \omega_0 t \cdot \sin \omega_E t = \cos (\omega_E - \omega_0)t \quad (2)$$

Therefore, as is apparent from the aforementioned equations, one (sin $(\omega_E - \omega_0)t$) of the phase-modulated two-phase synthetic signals which are obtained from the adder 12, and the other (cos $(\omega_E - \omega_0)t$) thereof are inputted to multipliers 15 and 16, respectively. Moreover, two-phase sin-wave signals (sin $\omega_R t$, cos $\omega_R t$) outputted from a reference signal generator 17 such as a crystal oscillator are also inputted to the multipliers 15 and 16. Then, the aforementioned two-phase synthetic signals (sin $(\omega_E - \omega_0)t$, cos $(\omega_E - \omega_0)t$) are multiplied by the two-phase synthetic signals sin $(\omega_E - \omega_0)t$, cos $(\omega_E - \omega_0)t$ in the multipliers portions 15 and 16 and subtracted in a subtractor portion 18, to obtain a synthesized signal (sin $(\omega_E - \omega_R)t$ as expressed in the following equation:

$$\sin (\omega_E - \omega_0)t \times \cos \omega_R t - \cos (\omega_E - \omega_0)t \times \sin \omega_R t = \sin (\omega_E - \omega_0 - \omega_R)t \quad (3)$$

The term on the right side of equation (3) corresponds to an error voltage (namely, a deviation or error) E of the well-known PLL system, the entirety of which is phase-controlled as illustrated in FIG. 2. In the case where the PLL system normally operates, the error voltage E becomes almost zero at all times, as is well known in the art. Consequently, the following equations are obtained:

$$E = \sin (\omega_E - \omega_0 \omega_R)$$

In the case that $$E = 0, \omega_E = \omega_R + \omega_0 \quad (4)$$

Thus, the aforesaid equations (4) mean that the exciting angular frequency ($\omega_E$) of the resolver 2 increases or decreases according to the angular velocity ($\omega_0$) in such a manner that the error voltage E can be held at almost zero. The error voltage E is introduced or applied to a well-known loop compensator 20 of a posterior stage. Thus, the stability and responsivity of a control system constructed as the PLL system are improved. Then, a signal representing the error voltage E is converted into a digital pulse 21a in the VCO 21 of a further posterior stage. Thereafter, this digital pulse 21a is integrated in a well-known counter 22 and is converted by an excitation circuit 23 into a sin-wave excitation signal sin $\omega_E t$. Moreover, a digital angle output $\theta$ and a digital angular velocity output $\omega_0$ are obtained from the digital pulse 21a, which is outputted from the VCO 21, through a processing circuit 25.

Referring next to FIG. 3, there is shown the configuration of the system of FIG. 2 in more detail. In FIG. 3, a quantitative value concerning each signal is shown for reference purposes. Only parts different from the parts of FIG. 2 will be described. The respective two-phase resolver signals (sin $\omega_0 t \cdot \sin \omega_E t$, cos $\omega_0 t \cdot \sin \omega_E t$) are inputted to an off-line detection circuit 30 and syncro phase detection circuit 30A, and the off-line detection circuit 30 generates a sensor error signal 30a. Further, an occurrence of a disconnection or break in the resolver 2 and the signal transmission system 14 is detected by monitoring the amplitudes of the two-phase resolver signals and by further checking whether or not voltages represented by the two-phase resolver signals are present.

Moreover, an error voltage E is detected by an error voltage monitor 31 provided in parallel with the loop compensator 20. In the case where the error voltage E comes to have a voltage level equal to or higher than a predetermined level, this can be detected as a system abnormality which has occurred in the PLL system. Furthermore, the number of clock signals 17a outputted from the reference signal generator portion 17 are counted by a counter 17A, the counter 17A being reset by a clear signal CLR from the syncro phase detection circuit 30A. A reference value $\omega_R \cdot t$ obtained by the couner 17A is inputted to two-phase read-only memories (ROM) 40 and 41. Two-phase sine-wave signals cos $\omega_R t$ and sin $\omega_R t$ obtained by the ROMs 40 and 41 are inputted to the multipliers 15 and 16, respectively.

Further, the processing portion 25 of FIG. 2 is constructed as illustrated in FIG. 3. A digital pulse 21a representing a value of $\omega_E$, which is outputted from the VCO 21, is inputted to a processing counter 50. Furthermore, the value of a count 50a, which is outputted from this processing counter 50 and represents $\omega_E t$, and the value of a count (namely, a reference value), which is outputted from the reference counter 17A connected with the clock signal 17a and represents $\omega_R t$, are inputted to a first subtraction portion 51. A result of a subtraction performed in the first subtraction portion 51 is outputted therefrom as a digital angle output $\theta$. Namely, the digital angle output $\theta (= \omega_0 \cdot t = \omega_E \cdot t - \omega_R \cdot t)$ can be outputted in real time by subtracting a reference value $\omega_R \cdot t$, which is obtained by counting the number of the clock signals 17a in the reference counter 17A, from the number of the counted value 50a which is obtained by the processing counter 50 in which a digital pulse 21a from the VCO 21 is counted, in the first subtraction portion 51.

Further, a first latch portion 53 is connected to the subtraction portion 51, and a second latch portion 54 is connected to the first latch portion 53. A setting signal 52a is inputted from a resolution setting portion 52 to each of the latch portions 53 and 54. Additionally, the processing portion 25 is further provided with a second subtraction portion 55 to which outputs $\theta_n$ and $\theta_{n-1}$ of the latch portions 53 and 54 (namely, data representing the digital angle outputs $\omega$, which are outputted with a time lag) are inputted. An angular velocity output $\omega_0$ is outputted from this second subtraction portion 55. Therefore, after being latched by the latch portion 53 and 53, respectively, as old and new digital angle outputs $\theta_n$ and $\theta_{n-1}$ outputted at constant intervals with a time lag, the digital outputs $\theta$ are inputted to the second subtraction portion 55. The difference between the digital angle outputs $\theta_n$ and $\theta_{n-1}$ is obtained by the second subtraction portion 55. Thereby, a digital angular velocity output $\omega_0$ is obtained. In this case, the timing of the updating of the digital angle outputs $\theta_n$ and $\theta_{n-1}$ respectively latched by the latch portions 53 and 54 can be set by using the setting signal 52a in such a manner that the updating is performed in a constant cycle. The resolution of the angular velocity, however, can be changed by varying this cycle or period. If a setting signal 52a consisting of latch pulses outputted at 1 m-sec intervals is generated similarly as in the cases of examples of the resolutions ranging from 8 bits to 12 bits, as illustrated in FIG. 3, 250 (rps)×$2^{12}$ (bits/rev)×0.001 (sec)= 1024 (bits)=$2^{10}$ (bits). Thus, a 10-bit resolution (namely, 1/1024≈0.1%) can be obtained as the resolution of the angular velocity.

The system for performing the digital angle detecting method of the present invention is constructed as described hereinabove. Thus the following effects can be obtained.

Namely, an amplitude-modulated two-phase resolver signal is converted into shifted two-phase resolver signals which are shifted in phase and are further phase-modulated. Further, the PLL system containing the excitation circuit for the excitation of the resolver is constituted. Thereby, the system for performing this digital angle detecting method can produce stable angle outputs and angular velocity outputs that are little affected by the impedance of a signal transmission line, which is determined on the basis of the length of the cable or line between the resolver and the signal processing portion, and a change in temperature. Further, the resolution of the angular velocity is set as being variable by using a setting signal outputted from the velocity resolution setting portion 52. Thus, a variable digital angular velocity output can be obtained. Moreover, a digital angle output is obtained by performing a subtraction between the reference value and the counted number of digital pulses. Thus, a digital angle output can be obtained in real time. Furthermore, the system has the disconnection detecting portion and the error voltage monitor and so forth. Thus, the system has the function of performing self-diagnosis/abnormality-detection on the entire configulation thereof. Thereby, the system can realize or develop more systematic functions in cooperation with a host control system. Incidentally, the resolver used in the system of the present invention is not limited to that of the amplitude modulation type. All sensors and transducers, which have amplitude-modulated outputs, may be effectively used in the system of the present invention instead of such a resolver.

Although the preferred embodiment of the present invention has been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A digital angle detecting method, comprising the steps of:

a) shifting the phases of original two-phase resolver signals (sin $\omega_0 t \cdot \sin \omega_E t$ and cos $\omega_0 t \cdot \sin \omega_E t$, wherein $\omega_E$ denotes an exciting angular frequency) obtained from a resolver of the one-phase-excitation/two-phase-output type, which is supplied with an exciting source signal (sin $\omega_E t$) and serves as an angle detecting device of the amplitude modulation type, by $-90°$ in phase shifting circuits (10, 11), respectively;

b) obtaining two-phase synthetic signals (sin ($\omega_E - \omega_\theta$)t, cos ($\omega_E - \omega_\theta$)t) by respectively adding and subtracting said shifted two-phase resolver signals ($-\sin \omega_\theta \cdot \cos \omega_E t$, $-\cos \omega_\theta \cdot \cos \omega_E t$) and the original two-phase resolver signals;

c) obtaining a synthesized signal (sin ($\omega_E - \omega_\theta - \omega_R$)t) by multiplying the two-phase synthetic signals by two-phase sine-wave signals (sin $\omega_R t$, cos $\omega_R t$); and d) obtaining an angle output ($\theta$) and an angular velocity output ($\omega_\theta$) by processing said synthesized signal (sin ($\omega_E - \omega_\theta - \omega_R$)t).

2. The digital angle detecting method according to claim 1, wherein the two-phase resolver signals (sin $\omega_0 t \cdot \sin \omega_E t$, cos $\omega_0 t \cdot \sin \omega_E t$) are monitored by an off-line detection circuit, and wherein an occurrence of a disconnection or off-line in the resolver and a signal transmission system is detected by judging whether or not a voltage represented by each of the two-phase resolver signals is present.

3. The digital angle detecting method according to claim 1, wherein an occurrence of a system abnormality in a phase-locked loop system is detected by monitoring an error voltage by using the synthesized signal.

4. The digital angle detecting method according to claim 2, wherein an occurrence of a system abnormality in a phase-locked loop system is detected by monitoring an error voltage by using the synthesized signal.

* * * * *